(12) United States Patent
Bhosle et al.

(10) Patent No.: US 11,120,973 B2
(45) Date of Patent: Sep. 14, 2021

(54) PLASMA PROCESSING APPARATUS AND TECHNIQUES

(71) Applicant: APPLIED Materials, Inc., Santa Clara, CA (US)

(72) Inventors: Vikram M. Bhosle, North Reading, MA (US); Christopher J. Leavitt, Gloucester, MA (US); Guillermo Colom, Salisbury, MA (US); Timothy J. Miller, Ipswich, MA (US)

(73) Assignee: Applied Materials, Inc., Santa Clara, CA (US)

( * ) Notice: Subject to any disclaimer, the term of this patent is extended or adjusted under 35 U.S.C. 154(b) by 88 days.

(21) Appl. No.: 16/409,242

(22) Filed: May 10, 2019

(65) Prior Publication Data

US 2020/0357611 A1 Nov. 12, 2020

(51) Int. Cl.
*H01J 37/00* (2006.01)
*H01J 37/32* (2006.01)
*H01L 21/265* (2006.01)
*C23C 14/48* (2006.01)
*H01J 37/317* (2006.01)

(52) U.S. Cl.
CPC ........ *H01J 37/32412* (2013.01); *C23C 14/48* (2013.01); *H01J 37/3171* (2013.01); *H01L 21/265* (2013.01)

(58) Field of Classification Search
CPC ............ H01J 37/32412; H01J 37/3171; H01L 21/265; H01L 27/112; H01L 21/2236; C23C 14/48

USPC .............. 250/492.1–492.3, 493.1; 118/723 I, 118/723 E, 723 MW

See application file for complete search history.

(56) References Cited

U.S. PATENT DOCUMENTS

| | | | | |
|---|---|---|---|---|
| 5,393,986 | A * | 2/1995 | Yoshinouchi | ......... H01J 37/244 250/397 |
| 6,335,535 | B1 * | 1/2002 | Miyake | ............... H01L 21/0445 250/492.21 |
| 6,899,054 | B1 * | 5/2005 | Bardos | .................. C23C 16/517 118/723 E |

(Continued)

OTHER PUBLICATIONS

"Absolute total and partial cross sections for the electron impact ionization of diborane", Basner and , M. Schmidt, and K. Becker, J. Chem. Phys. 118, 2153 (2003), 7 pages.

(Continued)

*Primary Examiner* — Michael Maskell
(74) *Attorney, Agent, or Firm* — Kacvinsky Daisak Bluni PLLC

(57) ABSTRACT

An apparatus may include a main chamber, a substrate holder, disposed in a lower region of the main chamber, and defining a substrate region, as well as an RF applicator, disposed adjacent an upper region of the main chamber, to generate an upper plasma within the upper region. The apparatus may further include a central chamber structure, disposed in a central portion of the main chamber, where the central chamber structure is disposed to shield at least a portion of the substrate position from the upper plasma. The apparatus may include a bias source, electrically coupled between the central chamber structure and the substrate holder, to generate a glow discharge plasma in the central portion of the main chamber, wherein the substrate region faces the glow discharge region.

6 Claims, 5 Drawing Sheets

(56) References Cited

U.S. PATENT DOCUMENTS

| | | |
|---|---|---|
| 8,664,561 B2 | 3/2014 | Hadidi et al. |
| 2003/0015293 A1 | 1/2003 | Obuchi |
| 2005/0136604 A1 | 6/2005 | Al-Bayati et al. |
| 2005/0205212 A1* | 9/2005 | Singh ............... H01J 37/32412 |
| | | 156/345.48 |
| 2006/0219952 A1* | 10/2006 | Mehta ............... H01J 37/32412 |
| | | 250/492.21 |
| 2014/0035458 A1 | 2/2014 | Wu et al. |
| 2015/0136734 A1* | 5/2015 | Chae ............... H01J 37/32449 |
| | | 216/67 |
| 2015/0184291 A1* | 7/2015 | Alokozai ............ C23C 16/505 |
| | | 438/758 |

OTHER PUBLICATIONS

"Precise control of ions and Radicals using Electron beam generated plasmas", David. R. Boris, PPD, Naval Research Lab, AVS 2018, 10 pages.

"Plasma diagnostics in large area plasma processing system", D. Leonhardt, S. G. Walton, D. D. Blackwell, W. E. Amatucci, D. P. Murphy, R. F. Fernsler, and R. A. Meger, JVST A, 19 (4), 2001, 7 pages.

International Search Report and Written Opinion dated Aug. 27, 2020, for the International Patent Application No. PCT/US2020/031493, filed on May 5, 2020, 10 pages.

\* cited by examiner

PLASMA PROCESSING APPARATUS AND TECHNIQUES

BACKGROUND

Field

Embodiments relate to the field of protection devices, an in particular, to plasma processing devices.

Discussion of Related Art

Plasma immersion or plasma doping (PLAD) apparatus employ a configuration where the substrate is immersed or directly exposed to a plasma. In this manner, by tuning various parameters including bias voltage, doping, implantation, or etching of a substrate may be performed in a relatively simple apparatus. Plasma doping (PLAD) apparatus have attracted attention as a preferred doping technique for advanced semiconductor device technology nodes, while several challenges remain to be overcome before widespread adoption. One such challenge is the need to eliminate surface deposition, to avoid the need to perform a cleaning process after dopant implantation. Moreover, because of the introduction of SiGe contacts in source/drain regions of a transistor, conventional cleans are no longer compatible with the exposed materials of the source/drain region. There is also a continuous demand to improve center to edge uniformity as the edge exclusion gets smaller and smaller.

In the configuration of known PLAD apparatus, a plasma is generated and sustained primarily by the RF power when operating in inductively coupled plasma (ICP) mode. Current process space for stable operation requires high RF power in this mode and often leads to a high deposition rate of material derived from the plasma during implantation Control of the species being formed in a PLAD plasma (ions/neutral ratio), and impacting a substrate under these operating conditions also remains a challenge, since the substrate is directly exposed to the plasma.

One result of excess neutral exposure on a substrate during implant in a PLAD plasma is the formation of excessive deposition. In known plasma doping approaches, to address deposit formation during implant, a post-implant wet etch is performed, to remove the excess deposition to enable photoresist removal from masked regions not receiving implantation. This approach leads to higher cost of ownership for the doping process. Although, this approach may be adequate for present-day technology nodes in memory device applications, the post-implant cleaning is not compatible with a logic device process flow. One way to minimize deposition during implant is to sputter the deposition actively and thus prevent the build-up of the surface deposition. Notably the applicability for active sputtering during implant may be limited to two-dimensional (2D) device architectures and/or large size 3D structures, because of a resulting unacceptable corner sputtering of device structures.

With respect to these and other considerations, the present disclosure is provided.

BRIEF SUMMARY

In one embodiment, an apparatus is provided. The apparatus may include a main chamber, a substrate holder, disposed in a lower region of the main chamber, and defining a substrate region, as well as an RF applicator, disposed adjacent an upper region of the main chamber, to generate an upper plasma within the upper portion. The apparatus may further include a central chamber structure, disposed in a central portion of the main chamber, where the central chamber structure is disposed to shield at least a portion of the substrate position from the upper plasma. The apparatus may include a bias source, electrically coupled between the central chamber structure and the substrate holder, to generate a glow discharge plasma in the central portion of the main chamber, where the substrate region faces the glow discharge region.

In another embodiment, an apparatus may include a main chamber, a substrate holder, disposed in a lower region of the main chamber, and defining a substrate region, and an RF applicator, disposed adjacent an upper region of the main chamber. The apparatus may include a baffle assembly, disposed above the substrate region, where the baffle assembly separates the upper region of the substrate chamber from the substrate region. The apparatus may further include an RF source, coupled to the RF applicator, to generate a plasma in the upper region of the main chamber, and a bias source, electrically coupled between the baffle assembly and the substrate holder, to generate a glow discharge plasma in the lower region of the main chamber, where the substrate region is disposed in the glow discharge plasma. As such, the baffle assembly may screen the substrate region from the plasma in the upper region.

In a further embodiment, a method of processing a substrate may include providing a substrate on a substrate holder, disposed in a lower region of a main chamber of a plasma processing apparatus, where the main chamber includes a central chamber structure, disposed in a central portion of the main chamber. The method may include generating a first plasma in an upper region of the main chamber, using an RF applicator, and generating a second plasma in the lower region of the main chamber, wherein the substrate is screened from the first plasma by the central chamber structure.

DESCRIPTION OF EMBODIMENTS

Figure 1:
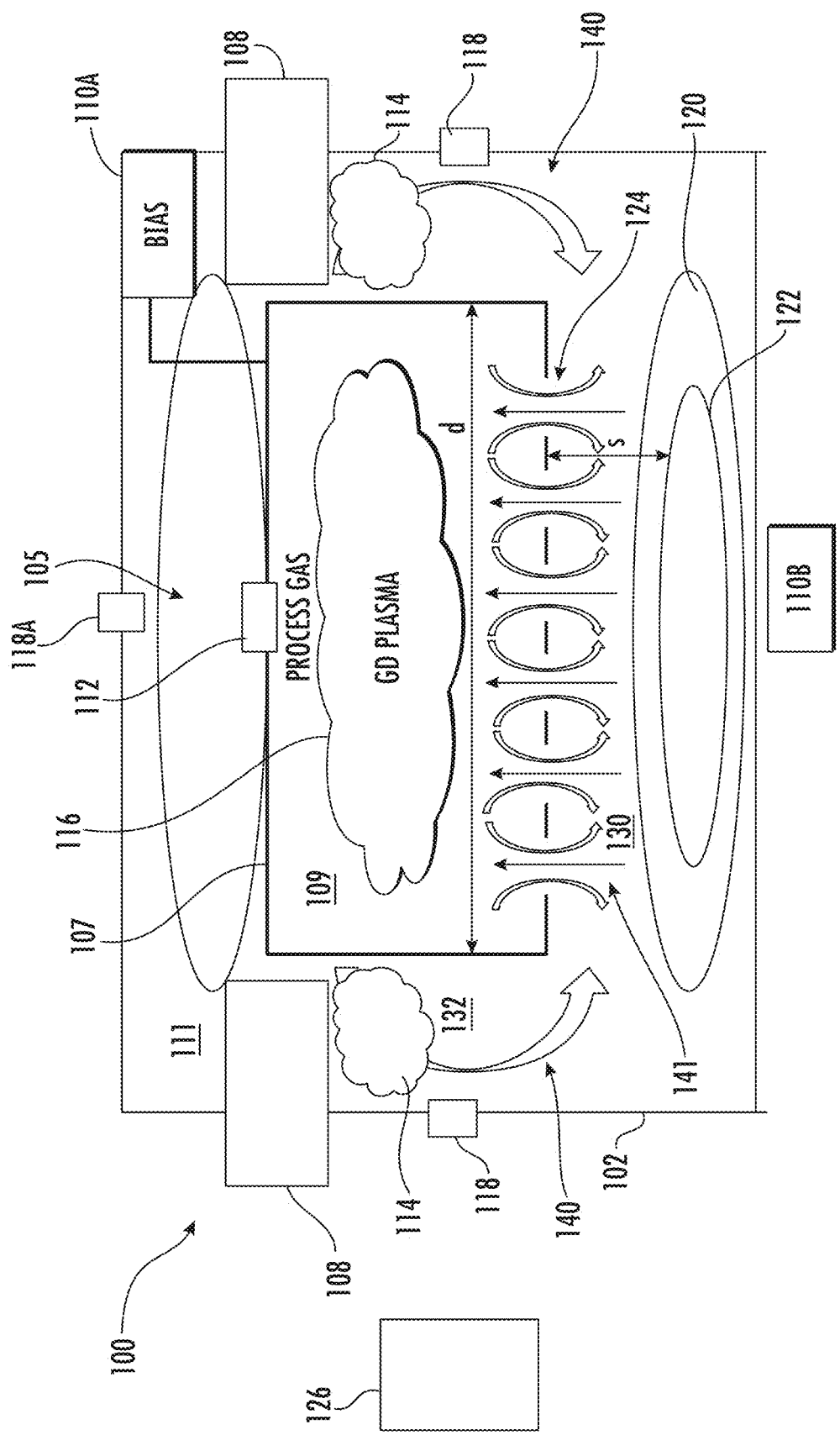
FIG. 1 shows a processing apparatus according to various embodiments of the disclosure.

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

The present embodiments provide novel apparatus and techniques, harnessing the advantages of two processes, namely RF generated plasma and glow discharge (GD) processing, enabling improved performance and new applications. By way of reference, in known plasma tools the plasma composition may vary substantially when operation conditions are changed to vary plasmas between an RF powered inductively coupled power (ICP) mode and a GD mode.

As an example, in a PLAD chamber, an RF inductive coil may be used to generate a plasma, while a bias voltage may also be applied between substrate and chamber to sustain a plasma in a glow discharge mode. For plasma doping of boron into a substrate, the present inventors have observed that when RF power is reduced to generate the plasma, the mode may shift from primarily RF induction plasma to glow discharge plasma, with a concomitant desirable reduction in boron deposition. However, operation in pure GD mode is susceptible to instability and may be limited to a narrow process space in terms of pressure, voltage, where charging and arcing are often observed.

In the present embodiments, these considerations are addressed in plasma apparatus having novel configurations, as detailed below. Turning now to FIG. 1, there is shown a plasma processing apparatus, referred to herein as processing apparatus 100, according to various embodiments of the disclosure. The processing apparatus 100 may include a main chamber 102 as shown. The processing apparatus may further include a substrate holder 120, provided to support a substrate 122, and disposed in a substrate region 130 of the processing apparatus 100. Alternatively, the substrate holder 120 may be omitted, while the substrate 122 may be placed in the substrate region 130, such as on a surface of the main chamber 102 or a structure provided in the main chamber 102. For purposes of illustration, the substrate holder 120 may be said to generally define the substrate region 130, in this example, a lower region of the main chamber 102, generally centrally disposed in the main chamber 102.

In the embodiment of FIG. 1, the processing apparatus 100 also includes an RF applicator 108, which applicator may be disposed adjacent an upper region 132 of the main chamber 102. The RF applicator 108 may be configured in a known manner, such as circumferentially around the main chamber 102, in various non-limiting embodiments. The processing apparatus 100 may include at least one gas port to admit process gas into the main chamber 102, such as the ports 118. Generally, the at least one gas port may be arranged as an upper gas port, or outer gas port. An RF source 126 may be coupled to the RF applicator 108, to generate a plasma in the upper region 132 of the main chamber 102.

According to various embodiments, processing apparatus, such as processing apparatus 100, may include a central chamber structure, in a central region 105 of the main chamber 102, where the central chamber structure is disposed to shield at least a portion of the substrate region 130 from an upper plasma in the main chamber 102, as detailed below. In the particular embodiment of FIG. 1, the central chamber structure is embodied as an inner chamber wall 107, defining an inner chamber 109 and an outer chamber 111, disposed around the inner chamber 109.

In operation, the processing apparatus 100 may be provided with multiple gas flows, meaning a first gas may be supplied in a first part of the processing apparatus 100, while a second gas is supplied in a second part of the processing apparatus 100. As shown in FIG. 1, a port(s) 118 is provided to admit a first gas directly into the outer chamber 111, including a top port 118A, while a port 112 is provided to admit a second gas directly into the inner chamber 109. In one non-limiting example, a reactive gas, including a reactive dopant gas or reactive etchant gas, used to generate species for plasma doping or plasma etching, is admitted through port 112 directly into the inner chamber 109, while an inert gas is admitted from an inert gas source through the ports 118 directly into the outer chamber 111.

In operation, the RF applicator 108 may generate an upper plasma 114, where the upper plasma is located in the outer chamber 111, generally above the substrate region 130, and outside of the inner chamber 109. In embodiments where the RF applicator 108 is a coil, the upper plasma may constitute an "ICP plasma," meaning a plasma that is predominantly sustained and generated by inductive coupling to generate an inductively coupled plasma. Diffusing species 140, from the upper plasma 114, may diffuse in the outer chamber 111, to substrate region 130.

Additionally, the processing apparatus 100 may include a bias source 110A, electrically coupled between the central chamber structure, such as the inner chamber wall 107. When the bias source 110A is operational, a bias voltage, such as a DC bias or pulsed DC bias, may be provided to inner chamber wall 107, to generate a glow discharge plasma 116 in the central region 105 of the main chamber 102. Exemplary bias applied to the inner chamber wall may range between −20 V and −10 kV in non-limiting embodiments. In this example, the glow discharge plasma 116 may be confined in part, or in whole, within the inner chamber 109. As further shown in FIG. 1, a DC bias, such as a pulsed DC bias, may be applied to substrate 122 using another supply, shown as substrate bias supply 110B The glow discharge plasma 116 may be sustained by secondary electrons 141, generated in the main chamber 102, such as at the substrate 122, wherein the substrate region 130 faces the glow discharge region. The glow discharge plasma 116 may be generated using bias applied to the substrate 122, bias applied to the inner chamber 109, or bias applied to both substrate 122 and inner chamber 109.

In various embodiments, the lower side of the inner chamber 109 may include a set of apertures, shown as apertures 124, where positive ions may traverse downwardly from the glow discharge plasma 116 to the substrate 122, while secondary electrons traverse upwardly from the substrate 122 into the glow discharge plasma 116. In some embodiments, certain parts of the inner chamber 109 may be energized to further boost the secondary electron density in cases where secondary electron emission from the substrate 122 is insufficient.

Advantageously, to address the concerns of substrate charging during processing, the upper plasma 114 acts as a pseudo plasma flood gun (PFG). In operation, the RF power supplied to generate the upper plasma 114 may be varied independently with respect to operation of the bias source 110. Thus, as detailed further below, the use of the RF source 126 offers additional process tuning as well as a process control "knob" for the glow discharge plasma 116. In addition, the width w of the inner chamber 109, and separation s between the lower surface of the inner chamber 109 and substrate holder 120 may be adjusted to increase or decrease the isolation of the upper plasma 114 from the substrate region 130, where a higher w/s ratio generates more effective screening of the substrate region 130 from the upper plasma 114. More generally, the dimensions of the inner chamber 109 as well as the width of the apertures 124 may be used to alter the plasma composition generated by secondary electrons.

In additional embodiments of the disclosure, a baffle assembly may be used as a central chamber structure, where the baffle assembly is also disposed to shield at least a portion of the substrate region 130 from an upper plasma in the main chamber 102.

Figure 2:
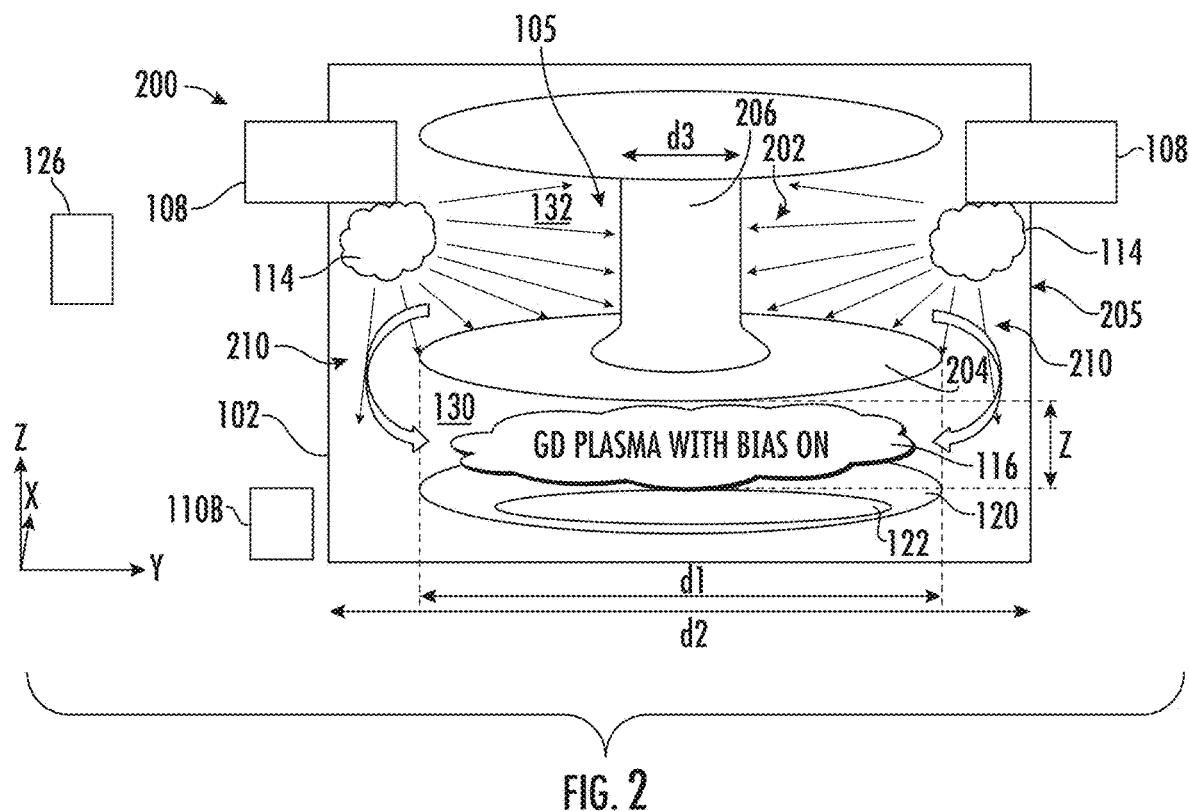
FIG. 2 shows another processing apparatus in accordance to additional embodiments of the disclosure.

In FIG. 2, a processing apparatus 200 is provided according to additional embodiments of the disclosure, including various components contained in apparatus 100, where like components are labeled the same. As shown in FIG. 2, a baffle assembly 202 is provided in the central region 105, where the baffle assembly 202 separates the upper region 132 of the main chamber from the substrate region 130. As shown in FIG. 2, the baffle assembly 202 comprises a lower portion 204, extending parallel to a main plane (X-Y plane of the Cartesian coordinate system) of the substrate holder 120, where the lower portion 204 extends along a first direction (Y-axis) within the main chamber 102, while providing a peripheral zone toward the side wall(s) 205 of the main chamber 102, where the upper region 132 can communicate with the substrate region 130. Said differently, the lower portion 204 may define a first width d1 along a first direction (e.g., Y axis) parallel to the main plane, where the main chamber 102 defines a second width d2, along the first direction, greater than the first width. In embodiments where the main chamber 102 is a cylindrical chamber, the first width d1 may correspond to a first diameter, while the second width d2 may correspond to a second diameter. The baffle assembly 202 may include an upper portion 206, having a narrower diameter or width, shown as d3.

As suggested by FIG. 2, the lower portion 204 may be disposed close to the substrate (along the Z axis), such as less than 10 cm in some non-limiting embodiments, to more effectively screen the substrate region 130 from the plasma in the upper region 132. This configuration allows more precise control of the flux of the ions and neutrals (such as depositing or etching species, depending upon the application) generated in the upper plasma 114 as opposed to species generated near the substrate 122 is substrate region 130. A portion of neutral species as well as ion species generated in the upper plasma 114 may diffuse around the periphery of the lower portion 204, which species are shown as diffusing species 210.

In certain implementations, the baffle assembly 202 may generate a dual plasma configuration, where the upper plasma 114 is primarily driven by RF power, from RF source 126, while the glow discharge plasma 116 in the substrate region 130 below the baffle assembly 202 is sustained mostly by the secondary electrons, generated in a glow discharge mode. Since the glow discharge plasma 116 may be independently controlled by application of bias from bias source 110, the relative strength of the glow discharge plasma 116 with respect to upper plasma 114 may also be varied. Moreover, the relative ratio of neutrals to ions impacting the substrate 122 may be controlled by adjusting the ratio of d1 to Z. More particularly, a higher d1/Z ratio may produce a higher ratio of ions to neutrals, by more effectively screening out neutrals created in the upper plasma 114.

In accordance with various non-limiting embodiments of the disclosure, materials used to construct a central structure such as an inside chamber or central baffle may be made of the same material as the main chamber, including a metal or a ceramic. In some embodiments, a central structure may be formed from a metallic part that is coated with a ceramic.

Figure 3:
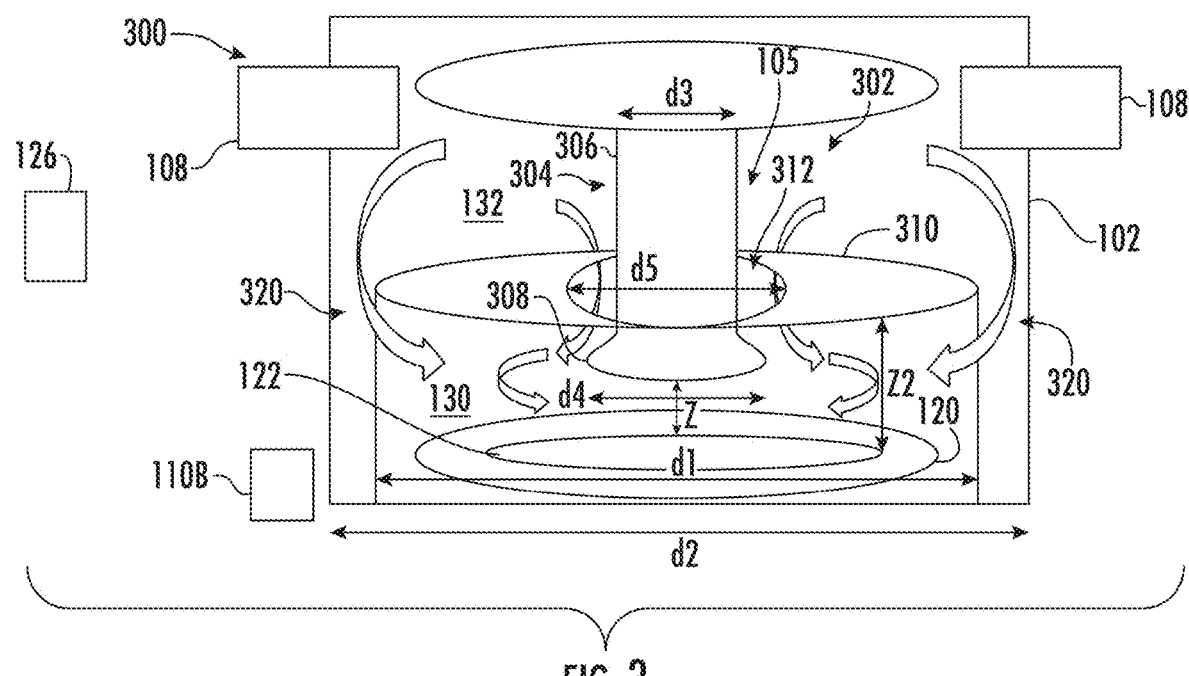
FIG. 3 shows another processing apparatus in accordance to additional embodiments of the disclosure.

FIG. 3 provides another example of a processing apparatus 300, according to further embodiments of the disclosure. The processing apparatus 300 may be deemed a variant of the processing apparatus 200, where in this embodiment, a baffle assembly 302 is provided in multiple parts, including a central portion 304, having an upper part 306, comprising a first baffle diameter, shown as d3. The baffle assembly 302 also includes a lower part 308, having a second baffle diameter, shown as d4, and greater than the first baffle diameter. Thus, the baffle assembly 302 is flared at the bottom. The baffle assembly 302 also includes an outer portion 310, disposed around the upper part 306 of the central portion 304. The outer portion 310 may be configured as a ring in some embodiments, to surround the central portion 304, while providing a space between the outer portion 310 and the central portion 304. As shown, the outer portion 310 and central portion 304 define an aperture 312, which aperture provides gas-phase communication between the upper region 132 and the substrate region 130.

The provision of the aperture 312 may allow diffusion of species between the upper region 132 and substrate region 130, while also screening species from the upper region 132 from directly impacting on the substrate 122. In some embodiments the lower part 308 may be flared to overlap with the outer portion 310 in the X-Y plane. Said differently, the outer portion 310 may define a ring or similar structure having an inner diameter, shown as d5, that is greater than the first diameter d3, while at the same time the outer portion 310 is separated from the substrate holder 120 by a second distance, shown as Z2 along a second direction (the Z-axis), where the second distance is greater than the first distance, Z. This arrangement places the outer portion 310 above the lower part 308, and surrounding the upper part 306, so the inner diameter d5 of the outer portion 310 may be sized larger than d3, to avoid contact with the upper part 306. At the same time, because the outer portion 310 is above the lower part 308, the inner diameter d5 of outer portion 310 may be less than or equal to d4, and may still create the aperture 312, while screening the substrate 122 from species exiting the upper region 132 along vertical trajectories. At the same time, the outer portion 310 may be provisioned with an outer diameter equivalent to d1, so that diffusing species 320 created by a plasma (the plasmas are omitted for clarity of illustration) may diffuse around the periphery of the outer portion 310 as shown.

Notably, for the embodiments of FIG. 2 and FIG. 3, the value of d1 may also match or exceed the diameter of the substrate 122. In the embodiment of FIG. 3, the gap or size of the aperture 312 may be adjusted to control the flux of species generated in the upper region 132 and substrate region 130. Furthermore, the plasma characteristics of a GD plasma (not shown) created in the substrate region 130 may be controlled by tuning the RF powered plasma conditions in the upper region 132 and tailoring the size of the aperture 312 between the central portion 304 and outer portion 310.

In accordance with some embodiments of the disclosure, an apparatus configured as shown in FIG. 2 may generate an improved plasma doping process to dope a substrate with boron. To improve boron plasma doping, better control to limit boron deposition occurring during implantation of the boron may be useful. In known plasma doping apparatus where a plasma maybe created using ICP mode or glow discharge mode between a substrate and a central structure situated 20 cm or 30 cm above the substrate, control of boron deposition may be difficult.

In various non-limiting embodiments, the lower portion of a baffle assembly may be placed very close to the substrate surface, such as 2 cm, 3 cm, 5 cm, or 10 cm (along the Z-axis), while the width or diameter (in the X-Y plane) of the baffle assembly along the lower part is set at a larger value, such as 30 cm or greater, sufficient to isolate an upper plasma (see upper plasma 114 of FIG. 2) at least partially, from the substrate region 130.

Experiments have been conducted with a variant of the processing apparatus 200 to analyze the chemical species generated in different regions, using optical emission spectroscopy (OES). Turning now to FIG. 4A, there is shown the geometry of the different OES measurements, where spectra were taken in both the upper region 132, as well as substrate region 130, where the results are shown in FIG. 4B and FIG. 4C, respectively.

Figure 4B:
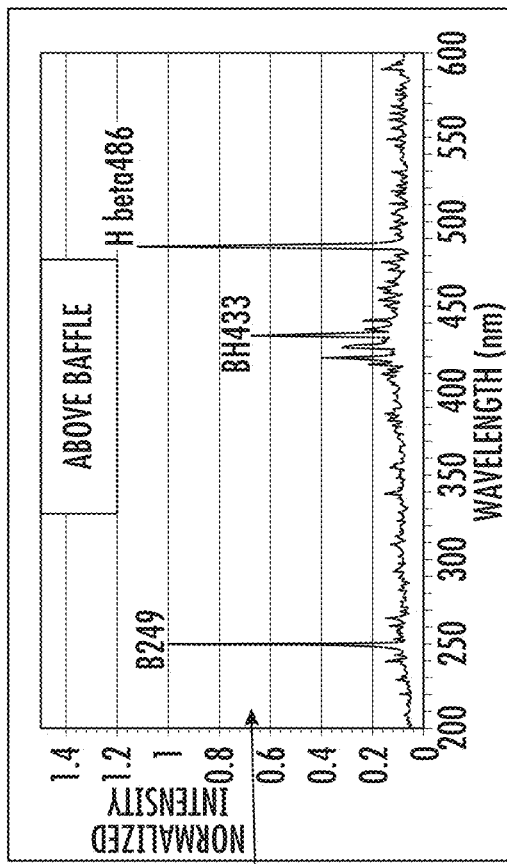
FIG. 4B presents data collected from a top region of the apparatus of FIG. 4A.
Figure 4C:
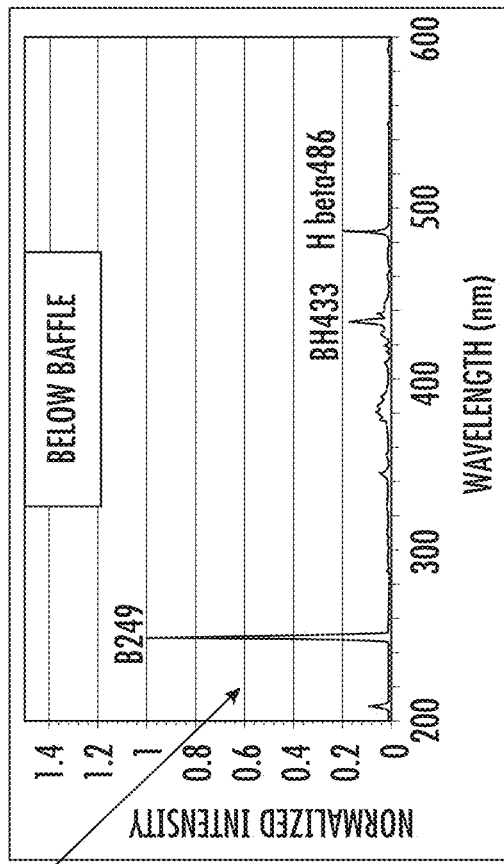
FIG. 4C presents data collected from a lower region of the apparatus of FIG. 4A.
Figure 4A:
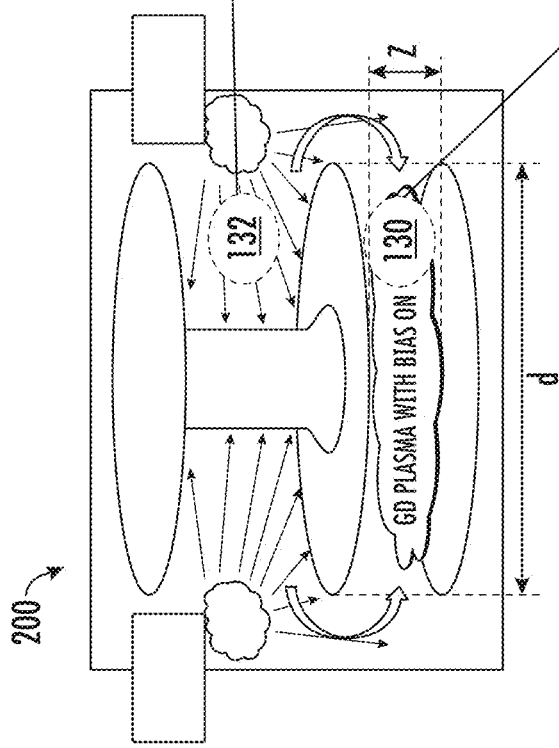
FIG. 4A presents the geometry for collecting compositional data in an apparatus according to the present embodiments.
Figure 4D:
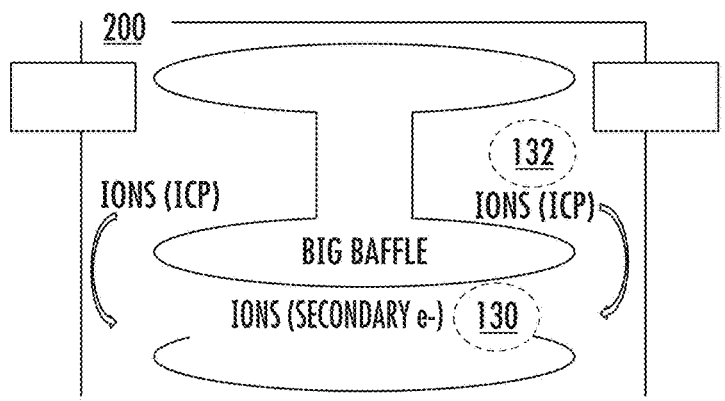
FIG. 4D presents the geometry for generating glow discharge ions and ICP ions in an apparatus according to embodiments of the disclosure.

FIG. 4B shows that the OES spectrum in the upper region 132 includes a strong B249 (meaning 249 nm wavelength) signal as well as a strong BH433 peak, as well as strong Hbeta486 peak. FIG. 4C shows that the OES spectrum taken from the substrate region 130 includes a somewhat strong B249 peak, while all other peaks including BH433 are suppressed effectively, indicating that boron deposition will be effectively suppressed in the substrate region 130. Also, as shown in the schematic depiction in FIG. 4D, the substrate region 130 is dominated more by glow discharge mode ions, as opposed to ICP generated ions, which ions are predominant in the upper region 132.

In further experiments, the effect of RF power on process uniformity across a wafer (substrate) placed in the processing apparatus 200 was calculated for a series of different power conditions. Table I presents the results of-experiment for a silicon substrate disposed under the lower portion 204, after exposure to the glow discharge plasma 116 under different RF power conditions. As shown in Table I, the process non-uniformity at no RF power is 1.4%, while decreasing slightly to 0.9% at a relatively low RF power and increases to 1.6% at a medium RF power. Unexpectedly, when the applied RF power is ramped from no RF power to medium RF power, the process non-uniformity improves, that is, a decrease to 0.6% non-uniformity occurs.

TABLE I

| No RF power | low RF power | medium RF power | No RF power-medium power ramp |
|---|---|---|---|
| 1.4% | 0.9% | 1.6% | 0.6% |

In accordance with various embodiments, the aforementioned configurations, of apparatus 100, processing apparatus 200, processing apparatus 300, or similar configurations, may be employed to implant boron using known $B_2H_6$ or $BF_3$ plasma recipes. In the case of $B_2H_6$, introduction of a baffle or baffle-like hardware enables new processes with high(er) B ion fraction, accomplished via reduced hydrogen dilution, and optimizing RF power (e.g., in a range of 0 W-1500 W) and pressure (e.g., in a range of 3 mT-100 mT) simultaneously. Similar behavior has been observed for a $BF_3$ process, where tuning of RF power and pressure has led to increased boron dose retention, with minimal surface deposition. In additional non-limiting embodiments, the aforementioned apparatus may be used with other chemistries as well, including $B_2F_4$, or $AsH_3$, $PH_3$, $CH_4$, $GeH_4$, etc., as well as other processes requiring further tunability and control of ion/neutrals ratio at a substrate, such as substrate etching.

Generally, the provision of the structures, such as an inner chamber or baffle opens up further process space to adjust implantation, deposition, or etching processes, by decoupling glow discharge control from ICP plasma control. In accordance with additional embodiments, the configuration of FIG. 2 has been tested extensively for boron doping and has demonstrated that the boron deposition rate can be significantly reduced relative to boron ion flux, by adjusting RF power.

Figure 5A:
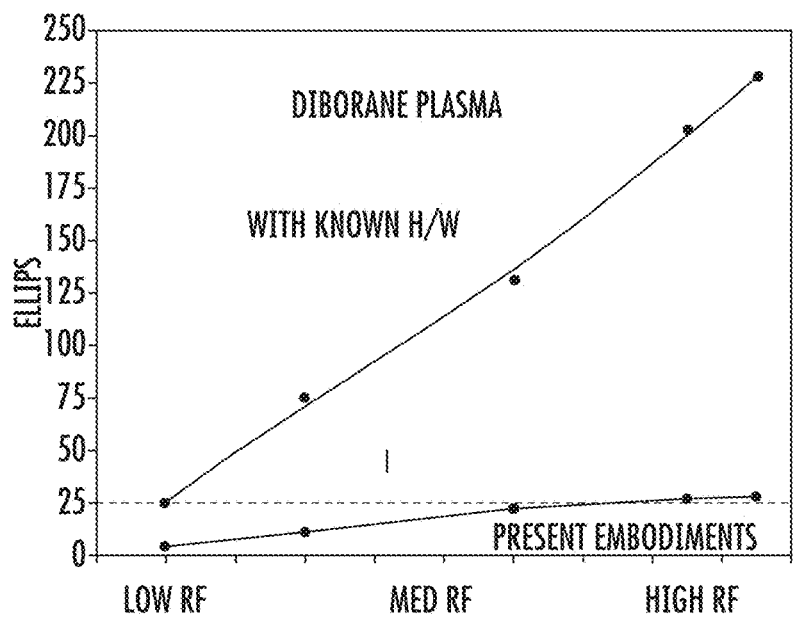
FIGS. 5A-5B provide further experimental results from operation of an apparatus of the present embodiments, as well as from a reference apparatus.

Turning to FIG. 5A, there is shown the result of deposition thickness measurements on a substrate exposed to a Diborane process with no bias, for a known plasma deposition apparatus, and for a variant of the processing apparatus 200 of the present embodiments. The thickness measurements are shown as a function of increasing RF power. A linear and strong increase in thickness takes place with increasing RF power up to a relatively high RF power condition for the known apparatus, while a very much smaller increase in thickness is observed for the processing apparatus 200.

Figure 5B:
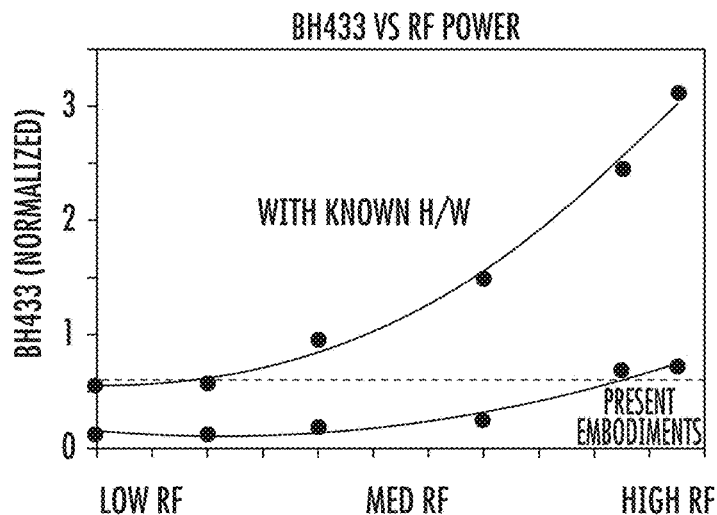

Turning to FIG. 5B, there is shown the result of the normalized intensity of the BH433 peak for the conditions corresponding to the data of FIG. 5A. Similarly to the results of FIG. 5A, the results of 5B show the BH433 peak is much smaller in the processing apparatus 200, and a much smaller increase takes place, even up to high RF applied power.

These results demonstrate that the combination of an apparatus arranged according to the present embodiments, along with low applied RF power process presents an attractive solution to achieve low deposition process enabled by GD operation.

Further evidence of preferentially minimizing deposition (neutrals) using the processing apparatus 200 was found where sheet resistance after processing was measured against a known apparatus, showing similar sheet resistance obtained by both techniques at all RF power levels. Deposition measured by quartz crystal monitor (QCM) was much lower in the processing apparatus 200, approximately 30% of the thickness found in the known apparatus.

When operating under glow discharge conditions, dose per pulse (DPP) is also maintained at similar levels with the new baffle at a given RF power, which result suggests ion flux is not impacted as significantly as the neutral flux in the vicinity of the wafer.

In further experiments, XTEM images were performed on Si semiconductor fins implanted using the aforementioned conditions in processing apparatus 200, demonstrating very little deposition on the surface of fins, as well as reduced damage, in comparison to processing of Si fins using a known PLAD apparatus.

Figure 6:
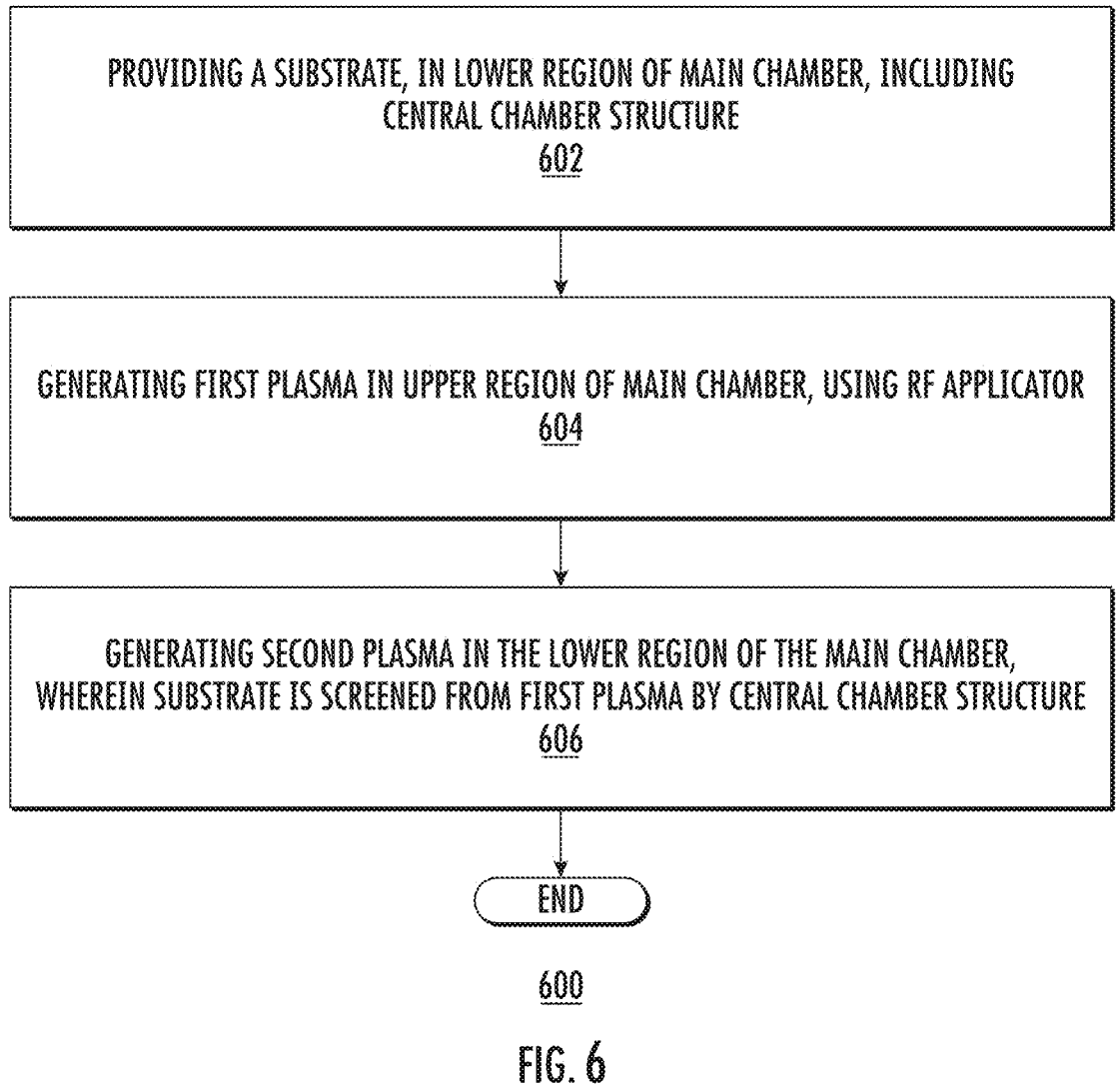
FIG. 6 depicts an exemplary process flow.

FIG. 6 provides a process flow 600, in accordance with embodiments of the disclosure. At block 602, a substrate is provided in a lower region of a main chamber of a plasma processing apparatus, which chamber includes a central chamber structure. In some embodiments, the central chamber structure may be an inner chamber, disposed within an outer chamber, where the inner chamber may be arranged to house a glow discharge plasma. In other embodiments, the central chamber structure may be a baffle assembly, having a lower portion that extends over the substrate in the lower region.

At block 604, a first plasma is generated in the upper region of the main chamber, using an RF applicator. In particular, the first plasma may be generated outside of inner chamber in embodiments that include the inner chamber. In embodiments having a baffle assembly, the first plasma may be generated generally above the lower portion of the baffle assembly.

At block 606, a second plasma is generated in the lower region of the main chamber, where the substrate is screened from the first plasma by the central chamber structure. As such, neutrals, as well as ions, generated in the first plasma, may be screened from directly impacting the substrate.

In summary, the present embodiments provide at least the following advantages. A first advantage of the apparatus and techniques of the present embodiments is the reduction of deposition during a PLAD implant, reducing or eliminating the need for post-implant cleaning, as well as reducing or eliminating active sputtering during implant, providing greater compatibility with 3D structures, such as FinFET and 3DNAND. Moreover, the elimination of a post-implant wet clean process enables the adoption of the B doping process with SiGe contact layers. A second advantage resulting from the reduced surface layer deposition during implant is the increased dose retention and lower implant energy needed to implant doping species to a desired depth in a device feature. A third advantage of the present embodiments is the ability to control a surface profile by controlling deposition rate of plasma species. A fourth advantage is the ability to reduce deep hydrogen related damage in hydride-based doping processes, useful for applications requiring precise control of different ion fractions. A fifth advantage afforded by the present embodiments is the ability to alter etching effects across a substrate by controlling ion/neutral ratio of species incident upon the substrate. A sixth advantage arises from the extra level of control over the ion/neutral ratio to address challenges for doping 3D structures, e.g, conformal doping of fins, wrap around contacts, S/D extensions, etc.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments, and may have the full scope defined by the language of the following claims, and equivalents thereof.

What is claimed is:
1. An apparatus, comprising:
a main chamber;
a substrate holder, disposed in a lower region of the main chamber, and defining a substrate region;
an RF applicator, disposed adjacent an upper region of the main chamber, to generate an upper plasma within the upper region;
a central chamber structure, disposed in a central portion of the main chamber, wherein the central chamber structure is disposed to shield at least a portion of the substrate region from the upper plasma, the central chamber structure comprising an inner chamber wall, defining an inner chamber and an outer chamber, disposed around the inner chamber; and
a bias source, electrically coupled between the central chamber structure and the substrate holder, to generate a glow discharge plasma in the central portion of the main chamber, wherein the substrate region faces the glow discharge.

2. The apparatus of claim 1, wherein the inner chamber further comprises:
a set of apertures disposed along a lower side of the inner chamber; and
a gas port to introduce a process gas directly to the inner chamber, wherein the glow discharge plasma is disposed within the inner chamber.

3. The apparatus of claim 1, further comprising:
an inert gas source, and an outer gas port, disposed to introduce an inert gas directly to the outer chamber; and
RF source, coupled to the RF applicator, to ionize the inert gas in the outer chamber, outside of the inner chamber.

4. A method of processing a substrate, comprising:
providing a substrate on a substrate holder, disposed in a lower region of a main chamber of a plasma processing apparatus, the main chamber including a central chamber structure, disposed in a central portion of the main chamber, the central chamber structure comprising an inner chamber wall, defining an inner chamber and an outer chamber, disposed around the inner chamber;
generating a first plasma in an upper region of the main chamber, using an RF applicator; and
generating a second plasma in the lower region of the main chamber, wherein the substrate is screened from the first plasma by the central chamber structure using a bias source, electrically coupled between the central chamber structure and the substrate holder, in the lower region of the main chamber, wherein the substrate region faces the second plasma.

5. The method of claim 4,
wherein the generating the first plasma comprises:
introducing an inert gas through a first port, disposed in the outer chamber; and
ionizing the inert gas using an inductive coil; and
wherein the generating the second plasma comprises, at least in part:
introducing a reactive gas through a second port, disposed in the inner chamber; and
ionizing the reactive gas by directing a plurality of secondary electrons from the substrate to the reactive gas, in the inner chamber.

6. The method of claim 5, wherein the directing the plurality of secondary electrons comprises:
generating a plurality of ions in the inner chamber; and
applying a bias voltage between the inner chamber and the substrate, wherein the plurality of ions strike the substrate.

* * * * *